United States Patent
Kang

(10) Patent No.: US 8,897,048 B2
(45) Date of Patent: Nov. 25, 2014

(54) SEMICONDUCTOR MEMORY DEVICE AND PROGRAMMING METHOD THEREOF

(75) Inventor: Won Kyung Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 210 days.

(21) Appl. No.: 13/450,982

(22) Filed: Apr. 19, 2012

(65) Prior Publication Data

US 2012/0268977 A1 Oct. 25, 2012

(30) Foreign Application Priority Data

Apr. 25, 2011 (KR) .................. 10-2011-0038306

(51) Int. Cl.
*G11C 15/04* (2006.01)
(52) U.S. Cl.
CPC ...................................... *G11C 15/04* (2013.01)
USPC .......................................................... 365/49.1
(58) Field of Classification Search
None
See application file for complete search history.

(56) References Cited

U.S. PATENT DOCUMENTS

2004/0190357 A1* 9/2004 Scheuerlein et al. ......... 365/222

FOREIGN PATENT DOCUMENTS

KR 1020100028195 A 3/2010

* cited by examiner

*Primary Examiner* — James G Norman
(74) *Attorney, Agent, or Firm* — William Park & Associates Patent Ltd.

(57) ABSTRACT

A semiconductor memory device includes a memory cell block configured to include a plurality of main cells and a plurality of CAM cells, a plurality of page buffers configured to store data to be programmed into the memory cell block, and a Y decoder configured to transfer CAM data to respective page buffers, selected from among the plurality of page buffers, in response to a data determination signal and CAM column addresses whenever the CAM data is inputted in a CAM data input mode.

17 Claims, 4 Drawing Sheets

SEMICONDUCTOR MEMORY DEVICE AND PROGRAMMING METHOD THEREOF

CROSS-REFERENCE TO RELATED APPLICATION

Priority is claimed to Korean patent application number 10-2011-0038306 filed on Apr. 25, 2011, the entire disclosure of which is incorporated herein by reference in its entirety.

BACKGROUND

Exemplary embodiments relate generally to a semiconductor memory device and a programming method thereof, and more particularly to a contents addressable memory (hereinafter referred to as CAM) and a programming method thereof.

Semiconductor memory devices such as a non-volatile memory device may use a CAM cell in order to store column repair information and CAM data (e.g., internal logic configuration information).

To improve the reliability of data stored in the CAM cell, the same CAM datum is stored multiple times by repeatedly inputting the CAM datum. That is, if 1 byte is necessary for CAM data, N bytes are actually programmed into the CAM cells and, in a read operation, N bytes are restored into 1 byte by using a multi-bit determination unit.

For example, assuming that 1 byte is stored as CAM data, 8 bytes are actually programmed into CAM cells and, in a read operation, the CAM data are read through the majority check method. That is, in the operation of programming the CAM data, the same data are inputted 8 times from the outside. For this reason, the time taken to input data increases, so that the time taken for a test operation for the mass production of devices increases. Furthermore, the memory capacity of test equipment for testing the semiconductor memory devices is gradually increased because the same CAM data are inputted multiple times to a semiconductor memory device and different CAM data are inputted to different chips.

BRIEF SUMMARY

Exemplary embodiments relate to a semiconductor memory device and a programming method thereof, which can reduce the time taken to input data and also program the same CAM data into a plurality of CAM cells by programming the same CAM data into a plurality of columns in a CAM data program operation.

A semiconductor memory device according to an embodiment of the present invention includes a memory cell block configured to include a plurality of main cells and a plurality of CAM cells, a plurality of page buffers configured to store data to be programmed into the memory cell block, and a Y decoder configured to transfer CAM data to respective page buffers, selected from among the plurality of page buffers, in response to a data determination signal and CAM column addresses whenever the CAM data is inputted in a CAM data input mode.

A semiconductor memory device according to an embodiment of the present invention includes a memory cell block configured to include a plurality of main cells and a plurality of CAM cells, a plurality of page buffers configured to store data to be programmed into the memory cell block, a CAM data input mode detector configured to generate a data determination signal in response to a block address and a page address, a column counter configured to output CAM column addresses, each increased by a set number, or normal column addresses, each increased by 1, in response to the data determination signal, and a Y decoder configured to transfer CAM data to respective page buffers, selected from among the plurality of page buffers, in response to the data determination signal and the CAM column addresses whenever the CAM data is inputted in a CAM data input mode.

A programming method of a semiconductor memory device according to an embodiment of the present invention includes making a determination of whether a mode is a CAM data input mode or a normal data input mode in response to a block address, a page address, an extra-block enable signal, and a data input signal, outputting CAM column addresses by counting an initial column address so that the initial column address becomes a set number if, as a result of the determination, the mode is the CAM data input mode, storing external CAM data in respective page buffers corresponding to the set number, from among a plurality of page buffers, in response to the CAM column addresses whenever the CAM data is inputted, and programming the stored CAM data into a CAM cell unit of a memory cell block.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
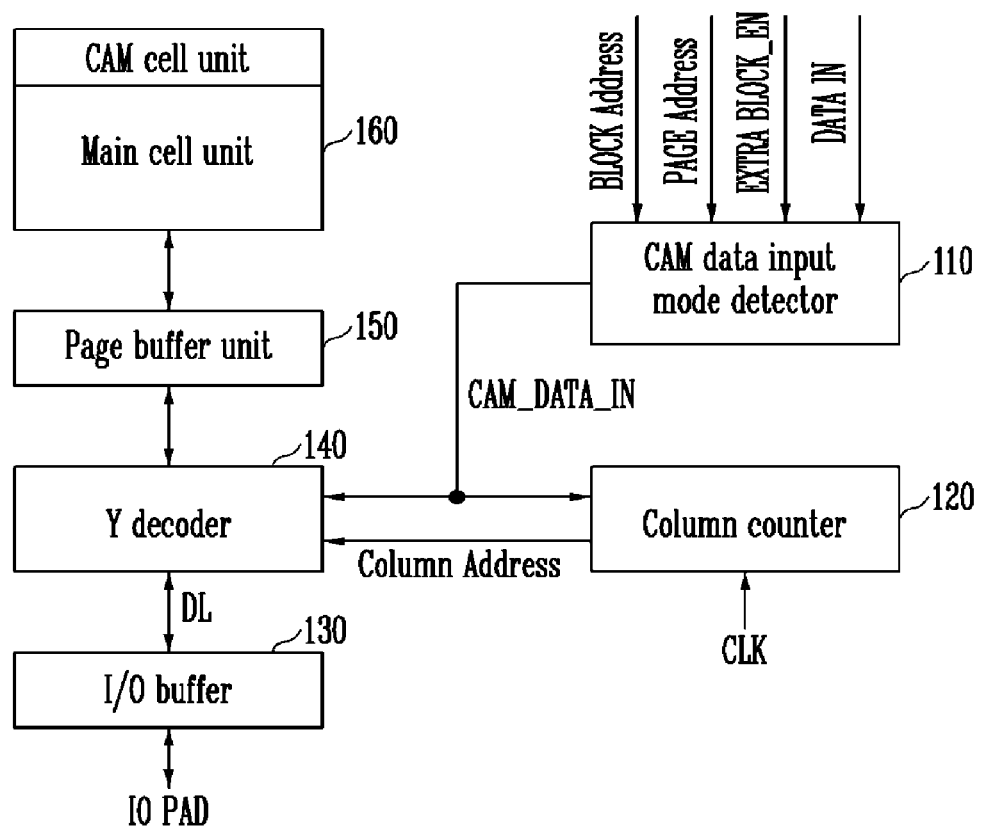
FIG. 1 shows the configuration of a semiconductor memory device according to an exemplary embodiment of the present invention.

FIG. 1 shows the configuration of a semiconductor memory device according to an exemplary embodiment of the present invention.

Referring to FIG. 1, the semiconductor memory device 100 includes a CAM data input mode detector 110, a column counter 120, an I/O buffer 130, a Y decoder 140, a page buffer unit 150 and a memory cell block 160.

The CAM data input mode detector 110 generates a data determination signal CAM_DATA_IN in response to a block address BLOCK Address, a page address PAGE Address, an extra-block enable signal EXTRA BLOCK_EN and a data input signal DATA IN. If the block address BLOCK Address and the page address PAGE Address correspond to the CAM cell unit of the memory cell block 160 and the extra-block enable signal EXTRA BLOCK_EN and the data input signal DATA IN are enabled, the CAM data input mode detector 110 generates the data determination signal CAM_DATA_IN enabled at a high level. On the other hands, if the block address BLOCK Address and the page address PAGE Address correspond to the main cell unit of the memory cell block 160, the CAM data input mode detector 110 generates the data determination signal CAM_DATA_IN disabled to a low level.

The column counter 120 outputs column addresses Column Address in response to the data determination signal CAM_DATA_IN and a clock signal CLK. In a normal data input mode in which the data determination signal CAM_DATA_IN is disabled, the column counter 120 outputs the column addresses Column Address, each increased by 1 whenever the clock signal CLK is toggled. In a CAM data input mode in which the data determination signal CAM_DATA_IN is enabled, the column counter 120 outputs the column addresses Column Address, each increased by a set number (e.g., 8), whenever the clock signal CLK is toggled. Here, the set number may be determined considering how many times is the same CAM datum repeatedly programmed. For example, assuming that 8 bytes are actually programmed into a CAM cell for storing 1 byte, the set number is set to 8.

The I/O buffer 130 receives input data through an I/O pad and outputs the input data to the Y decoder 140 through a data line DL.

The Y decoder 140 transfers the input data to the page buffers of the page buffer unit 150 in response to the column addresses Column Address and the data determination signal CAM_DATA_IN. Here, in the normal data input mode in which the data determination signal CAM_DATA_IN is disabled, the Y decoder 140 transfers the input data to the respective page buffers of the page buffer unit 150. In the CAM data input mode in which the data determination signal CAM_DATA_IN is enabled, the Y decoder 140 simultaneously transfers each of the input data to some of the page buffers of the page buffer unit 150, which correspond to the set number.

The page buffer unit 150 includes the plurality of page buffers corresponding to the plurality of respective column addresses. The page buffer unit 150 temporarily stores the input data in the plurality of page buffers and transfers the input data to the main cell unit or the CAM cell unit of the memory cell block 160 in the normal data input mode or the CAM data input mode so that the input data is programmed. In the page buffer unit 150, the page buffers correspond to the respective column addresses in the normal data input mode, and some of the page buffers correspond to one of the column addresses in the CAM data input mode.

The memory cell block 160 includes the CAM cell unit and the main cell unit. In the CAM data input mode, the voltage level of a bit line coupled to the CAM cell unit is controlled by input data stored in the page buffer unit 150. In the normal data input mode, the voltage level of a bit line coupled to the main cell unit is controlled by input data stored in the page buffer unit 150. Next, the CAM cell unit or the main cell unit is programmed by supplying a program voltage.

Figure 2:
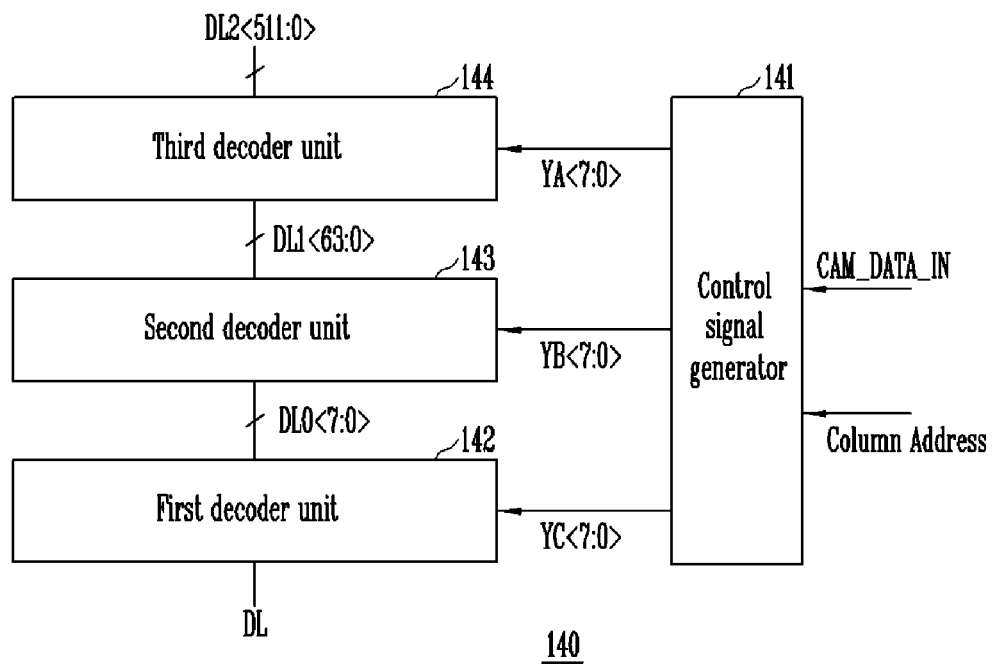
FIG. 2 shows the configuration of a Y decoder shown in FIG. 1.

FIG. 2 shows the configuration of the Y decoder 140 shown in FIG. 1.

Referring to FIG. 2, the Y decoder 140 includes a control signal generator 141, a first decoder unit 142, a second decoder unit 143 and a third decoder unit 144.

The control signal generator 141 generates first control signals YC<7:0>, second control signals YB<7:0> and third control signals YA<7:0> in response to the column address Column Address. For example, if the column address Column Address is a signal of 9 bits (e.g., 000111000), one of the third control signals YA<7:0> is enabled at a high level according to the least significant 3 bits (i.e., 000) of the signal, one of the second control signals YB<7:0> is enabled at a high level according to 3 bits (i.e., 111) subsequent to the least significant 3 bits, and one of the first control signals YC<7:0> is enabled at a high level according to the most significant 3 bits (i.e., 000) of the signal. Furthermore, the control signal generator 141 enables all the third control signals YA<7:0> to a high level irrespective of the least significant 3 bits (i.e., 000) of the signal in the CAM data input mode in which the data determination signal CAM_DATA_IN is enabled.

Figure 3:
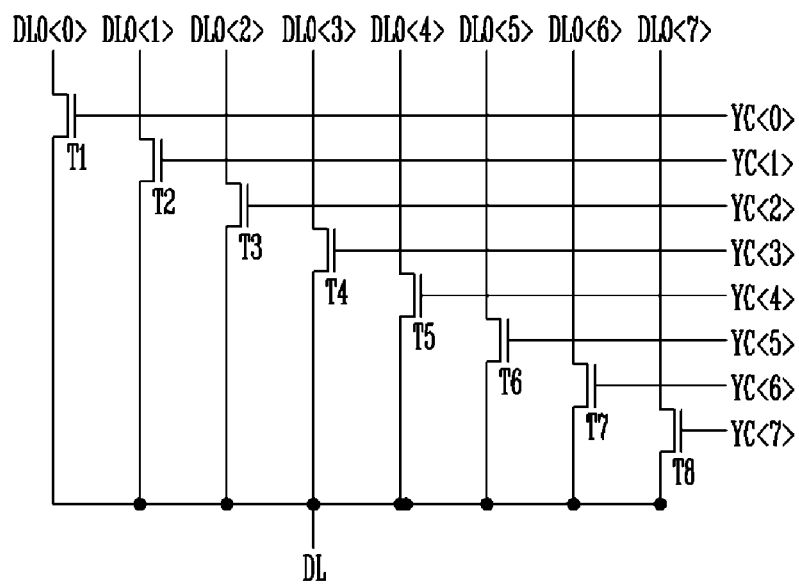
FIG. 3 is a detailed circuit diagram of a first decoder unit shown in FIG. 2.

FIG. 3 is a detailed circuit diagram of the first decoder unit 142 shown in FIG. 2.

Referring to FIG. 3, the first decoder unit 142 includes a plurality of switching elements T1 to T8. The switching elements T1 to T8 are coupled between the data line DL and a plurality of first internal data lines DL0<7:0>. The switching elements T1 to T8 couple the data line DL and the respective first internal data lines DL0<7:0> in response to the respective first control signals YC<7:0>.

In other words, the first decoder unit 142 couples the data line DL and one of the first internal data lines DL0<7:0> in response to the first control signals YC<7:0> in the normal data input mode and the CAM data input mode.

Figure 4:
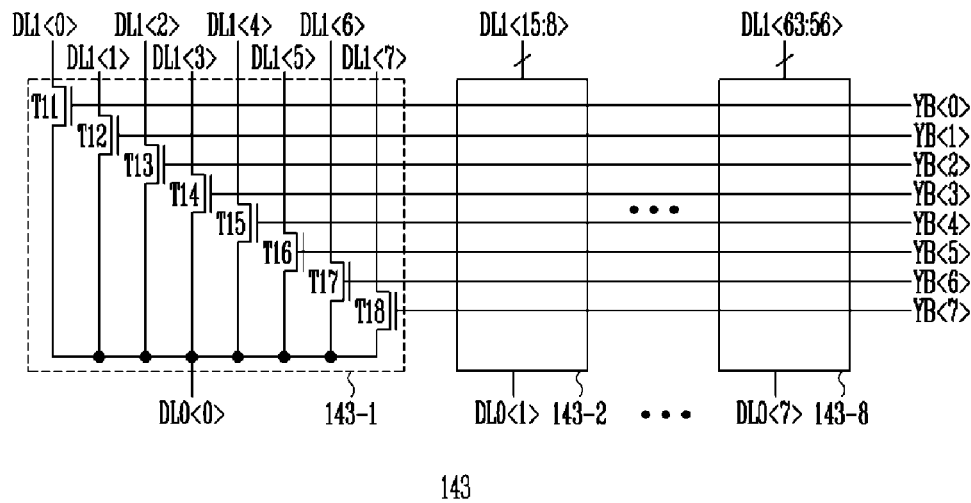
FIG. 4 is a detailed circuit diagram of a second decoder unit shown in FIG. 2.

FIG. 4 is a detailed circuit diagram of the second decoder unit 143 shown in FIG. 2.

Referring to FIG. 4, the second decoder unit 143 includes a plurality of decoders 143-1 to 143-8.

The decoders 143-1 to 143-8 are coupled to the first internal data lines DL0<7:0>, respectively. Furthermore, each of the decoders 143-1 to 143-8 is coupled to some of the second internal data lines DL1<63:0>, which correspond to a set number. In other words, each of the decoders 143-1 to 143-8 is coupled between each of the first internal data lines DL0<7:0> and some of the second internal data lines DL1<63:0> which correspond to a set number.

The decoders 143-1 to 143-8 have the same configuration, and thus only the decoder 143-1 is described below as an example.

The decoder 143-1 includes a plurality of switching elements T11 to T18. The switching elements T11 to T18 are coupled between the first internal data line DL0<0> and the second internal data lines DL1<7:0>. The switching elements T11 to T18 couple the first internal data line DL0<0> and the respective second internal data lines DL1<7:0> in response to the respective second control signals YB<7:0>.

The decoders 143-1 to 143-8 couple the respective first internal data lines DL0<7:0> and some of the second internal data lines DL1<63:0> in response to the second control signals YB<7:0> in the normal data input mode and the CAM data input mode.

Figure 5:
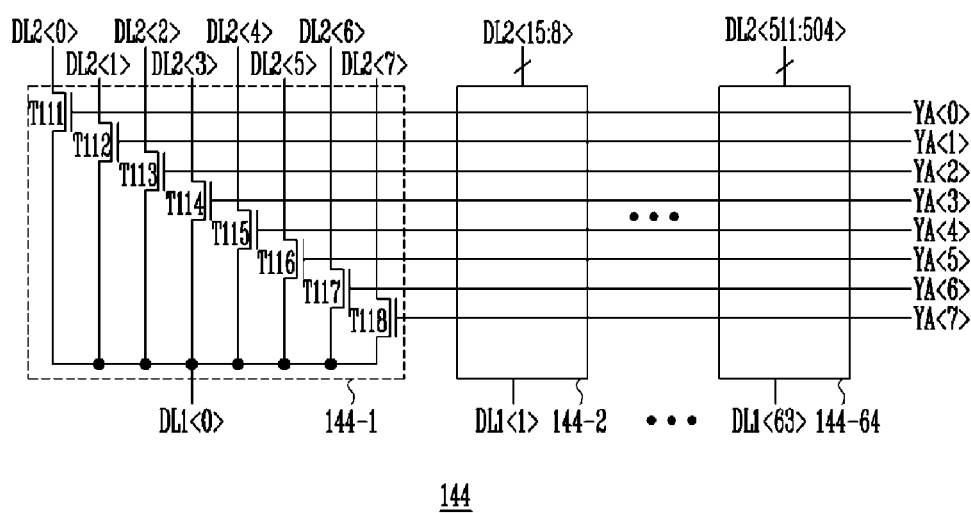
FIG. 5 is a detailed circuit diagram of a third decoder unit shown in FIG. 2.

FIG. 5 is a detailed circuit diagram of the third decoder unit 144 shown in FIG. 2.

Referring to FIG. 5, the third decoder unit 144 includes a plurality of decoders 144-1 to 144-64.

The decoders 144-1 to 144-64 are coupled to the second internal data lines DL1<63:0>, respectively. Furthermore, each of the decoders 144-1 to 144-64 is coupled to some of third internal data lines DL2<511:0> which correspond to a set number. In other words, each of the decoders 144-1 to 144-56 is coupled between each of the second internal data lines DL1<63:0> and some of the third internal data lines DL2<511:0> which correspond to a set number. The third internal data lines DL2<511:0> are coupled to the respective page buffers of the page buffer unit 150.

The decoders 144-1 to 144-64 have the same configuration, and thus only the decoder 144-1 is described below as an example.

The decoder 144-1 includes a plurality of switching elements T111 to T118. The switching elements T111 to T118 are coupled between the second internal data line DL1<0> and the respective third internal data lines DL2<7:0>. The switching elements T111 to T118 couple the second internal data line DL1<0> and the respective third internal data lines DL2<7:0> in response to the respective third control signals YA<7:0>.

The decoders 144-1 to 144-64 couple the respective second internal data lines DL1<63:0> and some of the third internal data lines DL2<511:0> in response to the third control signals YA<7:0> in the normal data input mode.

Furthermore, the decoders 144-1 to 144-64 couple the respective second internal data lines DL1<63:0> and some of the third internal data lines DL2<511:0>, which correspond to a set number, in response to the third control signals YA<7:0> all of which are enabled in the CAM data input mode. That is, the third internal data lines DL2<511:0> are coupled to any one of the second internal data lines DL1<63:0>.

Figure 6:
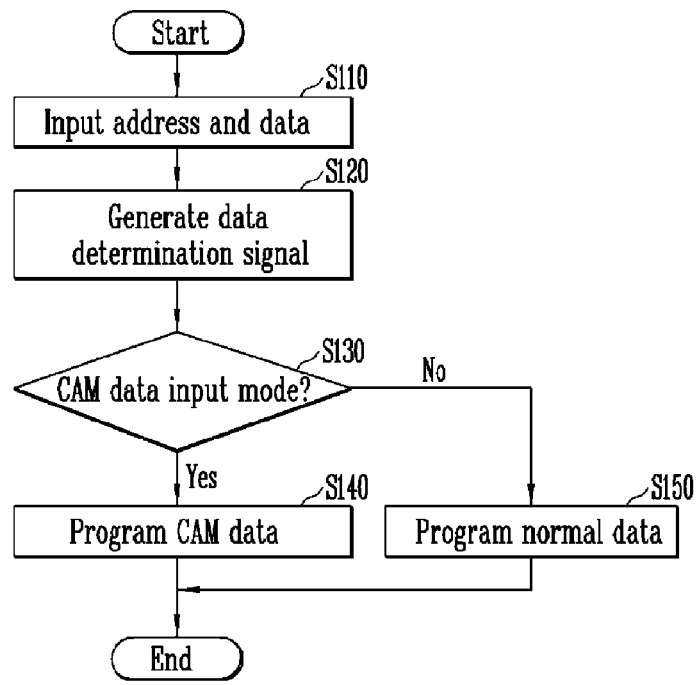
FIG. 6 is a flowchart illustrating a programming method of the semiconductor memory device according to an exemplary embodiment of the present invention.
Figure 7:
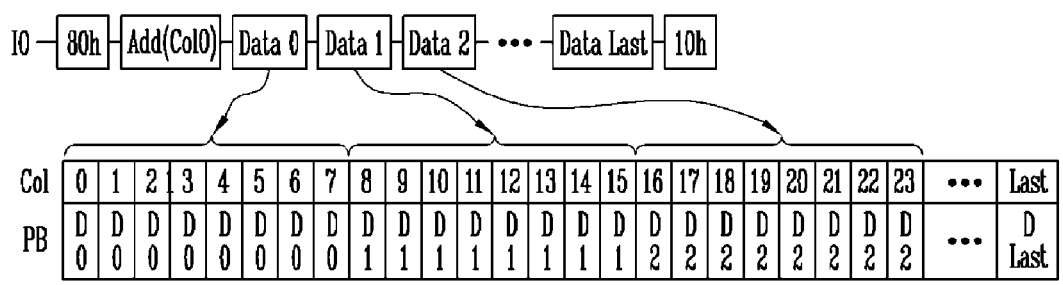
FIG. 7 is a data table illustrating a data input operation of the semiconductor memory device according to an exemplary embodiment of the present invention.

FIG. 6 is a flowchart illustrating a programming method of the semiconductor memory device according to an exemplary embodiment of the present invention. FIG. 7 is a data table illustrating a data input operation of the semiconductor memory device according to an exemplary embodiment of the present invention.

The programming method of the semiconductor memory device according to the exemplary embodiment of the present invention is described below with reference to FIGS. 1 to 3.

1) Inputting an Address and Data (S110)

After an external program operation command 80h is inputted, the block address BLOCK Address, the page address PAGE Address, an initial column address Column Address, the extra-block enable signal EXTRA BLOCK_EN and the data input signal DATA IN are inputted to the semiconductor memory device. Next, input data D0, D1, D2, . . . , D Last is sequentially inputted to the semiconductor memory device bit by bit.

2) Generating a Data Determination Signal (S120)

The CAM data input mode detector 110 generates the data determination signal CAM_DATA_IN in response to the block address BLOCK Address, the page address PAGE Address, the extra-block enable signal EXTRA BLOCK_EN and the data input signal DATA IN. The CAM data input mode detector 110 generates the data determination signal CAM_DATA_IN when the block address BLOCK Address and the page address PAGE Address correspond to the CAM cell unit of the memory cell block 160 and the extra-block enable signal EXTRA BLOCK_EN and the data input signal DATA IN are enabled.

3) Determining Whether a Mode is the CAM Data Input Mode (S130)

The CAM data input mode detector 110 determines whether a mode is the CAM data input mode or the normal data input mode depending on whether the data determination signal CAM_DATA_IN has been generated. That is, when the block address BLOCK Address and the page address PAGE Address correspond to the CAM cell unit of the memory cell block 160 and the extra-block enable signal EXTRA BLOCK_EN and the data input signal DATA IN are enabled, the CAM data input mode detector 110 determines that a mode is the CAM data input mode. If any one of the above conditions is not satisfied, the CAM data input mode detector 110 determines that the mode is the normal data input mode.

4) Programming CAM Data (S140)

If, as a result of the determination at step S130, the mode is determined to be the CAM data input mode, the column counter 120 outputs column addresses by increasing each of the column addresses by a set number (e.g., 8) in response to the data determination signal CAM_DATA_IN and the clock signal CLK. Here, the column counter 120 outputs the column addresses, each increased by the set number 8, by performing a counting operation starting from the initial column address Column Address (i.e., Col0). That is, if the initial column address Column Address is 000000000, the column counter 120 outputs the column addresses in order of 000001000, 000010000, 000011000, etc. when the clock signal CLK is toggled.

The Y decoder 140 transfers the input data D0, D1, D2, . . . , D Last, sequentially received bit by bit through the data line DL, to the respective page buffers of the page buffer unit 150 in response to the column addresses and the data determination signal CAM_DATA_IN. In the CAM data input mode, the data line DL is coupled to the third internal data lines, corresponding to the set number 8, through the first internal data lines and the second internal data lines in response to the data determination signal CAM_DATA_IN. Thus, one CAM datum is transferred to the page buffers corresponding to the set number 8. That is, one CAM datum is simultaneously transmitted to the page buffers coupled to any one of the decoders 144-1, 144-2, . . . , 144-64 of the third decoder unit 144.

The page buffer unit 150 temporarily stores the input data D0, D1, D2, . . . , D Last in the page buffers corresponding to the respective column addresses and then programs the input data D0, D1, D2, . . . , D Last by controlling the voltage level of a bit line coupled to the CAM cell unit of the memory cell block 160.

Accordingly, the input data D0, D1, D2, . . . , D last received through the I/O buffer 130 is stored in the plurality of CAM cells of the CAM cell unit.

5) Programming of Normal Data (S140)

If, as a result of the determination at step S130, the mode is determined to be the normal data input mode, the column counter 120 counts the column addresses in response to the clock signal CLK. Here, the column counter 120 counts the column addresses one by one from the initial column address Col0 and outputs the result of the count so that one column address is assigned to one input datum.

The Y decoder 140 transfers the input data D0, D1, D2, . . . , D Last to the respective page buffers of the page buffer unit 150 in response to the column addresses. Here, one input datum is transferred to a page buffer because the input datum corresponds to a column address and the Y decoder 140 couples the data line DL and one of the third internal data lines DL2<511:0>.

The page buffer unit 150 temporarily stores the input data D0, D1, D2, . . . , D Last in the page buffers corresponding to the respective column addresses and then programs the input data D0, D1, D2, . . . , D Last by controlling the voltage level of a bit line coupled to the main cell unit of the memory cell block 160 in a normal data program operation.

In accordance with various embodiments of the present invention, in the CAM data program operation of the semiconductor memory device, after a CAM datum is inputted, the same input CAM datum is programmed into a plurality of columns. Accordingly, the time taken to input data can be reduced, and the same datum can be programmed into a plurality of CAM cells.

What is claimed is:
1. A semiconductor memory device, comprising:
a memory cell block comprising a plurality of main cells and a plurality of CAM cells;
a plurality of page buffers configured to store data to be programmed into the memory cell block; and
a Y decoder transfers a CAM datum to multiple page buffers, selected from among the plurality of page buffers, in response to a data determination signal and CAM column addresses when the CAM datum is inputted in a CAM data input mode,
wherein the memory cell block stores the CAM data in each of the plurality of CAM cells, corresponding to a set number, in the CAM data input mode.

2. The semiconductor memory device of claim 1, wherein the Y decoder transfers a normal datum to a page buffer in response to the data determination signal and normal column addresses when the normal datum is inputted in a normal data input mode.

3. The semiconductor memory device of claim 2, further comprising a CAM data input mode detector for generating the data determination signal in response to a block address and a page address.

4. The semiconductor memory device of claim 3, further comprising a column counter for outputting the CAM column addresses, each increased by a set number, in response to the data determination signal in the CAM data input mode and outputting the normal column addresses, each increased by 1, in response to the data determination signal in the normal data input mode.

5. The semiconductor memory device of claim 3, wherein the data determination signal is enabled at a high level in the CAM data input mode and is disabled at a low level in the normal data input mode.

6. The semiconductor memory device of claim 4, wherein the column counter outputs the CAM column addresses or the normal column addresses by increasing an address from an initial column address in response to the data determination signal and a clock signal.

7. The semiconductor memory device of claim 6, wherein:
the column counter outputs the CAM column addresses or the normal column addresses by increasing the initial column address by the set number whenever the clock signal is toggled in the CAM data input mode, and
the column counter outputs the CAM column addresses or the normal column addresses by increasing the initial column address by 1 whenever the clock signal is toggled in the normal data input mode in which the data determination signal is disabled.

8. The semiconductor memory device of claim 4, wherein the Y decoder comprises:
a control signal generator configured to generate first to third control signals in response to the CAM column addresses or the normal column addresses and the data determination signal;
a first decoder unit coupled between a data line, coupled to an I/O buffer, and first internal data lines and configured to couple the data line to any one of the first internal data lines in response to the first control signals;
a second decoder unit coupled between the first internal data lines and second internal data lines and configured to couple each of the first internal data lines to some of the second internal data lines in response to the second control signals; and
a third decoder unit coupled between the second internal data lines and third internal data lines coupled to the plurality of page buffers and configured to couple each of the second internal data lines to some of the third internal data lines in response to the third control signals.

9. The semiconductor memory device of claim 8, wherein the third decoder unit couples all the second internal data lines to the third internal data lines in response to the data determination signal in the CAM data input mode.

10. A semiconductor memory device, comprising:
a memory cell block configured to comprise a plurality of main cells and a plurality of CAM cells;
a plurality of page buffers configured to store data to be programmed into the memory cell block;
a CAM data input mode detector configured to generate a data determination signal in response to a block address and a page address;
a column counter configured to output CAM column addresses, each increased by a set number, or normal column addresses, each increased by 1, in response to the data determination signal; and
a Y decoder configured to transfer CAM data to respective page buffers, selected from among the plurality of page buffers, in response to the data determination signal and the CAM column addresses whenever the CAM data is inputted in a CAM data input mode.

11. The semiconductor memory device of claim 10, wherein the Y decoder transfers normal data to one of the plurality of page buffers in response to the data determination signal and the normal column addresses whenever the normal data is inputted in a normal data input mode.

12. The semiconductor memory device of claim 11, wherein:
the column counter outputs the CAM column addresses by increasing an initial column address by the set number whenever a clock signal is toggled in the CAM data input mode in which the data determination signal is enabled, and
the column counter outputs the normal column addresses by increasing the initial column address by 1 whenever the clock signal is toggled in the normal data input mode in which the data determination signal is disabled.

13. The semiconductor memory device of claim 11, wherein the Y decoder comprises:
a control signal generator configured to generate first to third control signals in response to the CAM column addresses or the normal column addresses and the data determination signal;
a first decoder unit coupled between a data line, coupled to an I/O buffer, and first internal data lines and configured to couple the data line to any one of the first internal data lines in response to the first control signals;
a second decoder unit coupled between the first internal data lines and second internal data lines and configured to couple each of the first internal data lines to some of the second internal data lines in response to the second control signals; and
a third decoder unit coupled between the second internal data lines and third internal data lines coupled to the plurality of page buffers and configured to couple each of the second internal data lines to some of the third internal data lines in response to the third control signals.

14. The semiconductor memory device of claim 13, wherein the third decoder unit couples all the second internal data lines to the third internal data lines in response to the data determination signal.

15. The semiconductor memory device of claim 11, wherein the memory cell block stores the CAM data in each of some of the plurality of CAM cells, corresponding to the set number, in the CAM cell data input mode.

16. A programming method of a semiconductor memory device, comprising:
making a determination of whether a mode is a CAM data input mode or a normal data input mode in response to a block address, a page address, an extra-block enable signal and a data input signal;

outputting CAM column addresses by counting an initial column address so that the initial column address becomes a set number if, as a result of the determination, the mode is the CAM data input mode;

storing external CAM data in respective page buffers corresponding to the set number, from among a plurality of page buffers, in response to the CAM column addresses whenever the CAM data is inputted;

programming the stored CAM data into a CAM cell unit of a memory cell block.

outputting normal column addresses by increasing the initial column address by 1 if, as a result of the determination, the mode is a normal data input mode;

storing external normal data in one of the plurality of page buffers in response to the normal column addresses whenever the external normal data is inputted; and programming the stored normal data in a main cell unit of the memory cell block.

17. The programming method of claim 16, wherein programming the stored CAM data into the CAM cell unit includes storing the stored CAM data in CAM memory cells of the CAM cell unit corresponding to the set number.

* * * * *